United States Patent [19]

Aralis et al.

[11] Patent Number: 5,319,598
[45] Date of Patent: Jun. 7, 1994

[54] NONVOLATILE SERIALLY PROGRAMMABLE DEVICES

[75] Inventors: James M. Aralis, Mission Viejo; Frank J. Bohac, Jr., Laguna Hills, both of Calif.

[73] Assignee: Hughes Aircraft Company, Los Angeles, Calif.

[21] Appl. No.: 624,838

[22] Filed: Dec. 10, 1990

[51] Int. Cl.⁵ .............................................. G11C 13/00
[52] U.S. Cl. .................................. 365/189.12; 365/78
[58] Field of Search ...................... 365/189.01, 189.12, 365/189.04, 73, 78

[56] References Cited

U.S. PATENT DOCUMENTS 4,959,811  9/1990  Szczepanek ................... 365/189.12

*Primary Examiner*—Terrell W. Fears
*Attorney, Agent, or Firm*—Elizabeth E. Leitereg; Terje Gudmestad; W. K. Denson-Low

[57] ABSTRACT

An integrated circuit including a serial interface (12) having a nonvolatile memory (30) coupled to a and configuration of circuit boards and entire systems. A configurable circuits (10) containing switches, resistors, capacitors or digital logic devices has an unique identification code and is electrically configured by connection to a nonvolatile memory (30). An interrogation shift register (38) and a configuration data shift register (36) are serially connected to receive a serial bit stream (50) containing an interrogation code section and a configuration data section. The interrogation code, which is identical to the identification code of a selected one of the configurable circuits, is compared with the circuit identification code to provide a match pulse (42) that enables a program signal to initiate transfer of data from the data shift register (36) to the nonvolatile memory (30).

21 Claims, 4 Drawing Sheets

NONVOLATILE SERIALLY PROGRAMMABLE DEVICES

BACKGROUND OF THE INVENTION

1. Field of the Invention

The present invention relates to configurable circuits and more particularly concerns circuits that can be electrically configured and re-configured.

2. Description of Related Art

Many electronic circuits, including circuit boards and entire electronic systems, must be trimmed and configured either upon completion of manufacture, at installation or after some time of use. Often circuit components will drift due to aging or environmental factors, and thus need be adjusted for proper operation. Other circuits require such adjustments in order to alter operation and function of the circuit. Thus it is frequently desirable to selectively vary or adjust such circuit operations and parameters as frequency, resistance, capacitance, switch selection and data line selections. Presently trimming and configuration or reconfiguration of such circuits and system is accomplished by use of mechanical DIP switches and potentiometers, or sometimes by laser trimming of circuit components. These methods are slow or may require expensive equipment. Mechanical trimming switches, potentiometers and the like are expensive, relatively difficult to build and assemble, require physical access to the device and are inherently less reliable than electronic components. Laser trimming equipment is expensive and is generally available only upon manufacture of circuitry, and cannot be accomplished in the field.

Circuits have been programmed by use of EEPROM memories, but such prior art is able to handle configuration of several circuits only with great complexity and increased numbers of control lines. Prior arrangements, furthermore, make no provisions for digital readout of the actual configuration of the device, and, moreover, have been available only for a configurable potentiometer or an array of resistors.

Where circuit boards or systems operate in environments or packages that make access difficult, or where such circuits or devices are encapsulated, the circuit boards and systems may require trimming, adjustment or other reconfiguration which cannot be accomplished in presently available mechanical systems.

Accordingly, it is an object of the present invention to provide configurable circuits that avoid or minimize above mentioned problems.

SUMMARY OF THE INVENTION

In carrying out principles of the present invention in accordance with a preferred embodiment thereof, an electrically configurable circuit is provided with an identification code. Means are provided for interrogating the circuit to identify its code and means responsive to the interrogation may then control configuration or reconfiguration of the circuit. According to a feature of the invention a configurable circuit has its configuration controlled by a nonvolatile memory, and one of a plurality of such configurable circuits is selected by matching the circuit ID code with an interrogation code. Upon occurrence of a match, configuration data is entered into the nonvolatile memory for reconfiguration of the configurable circuit.

According to another feature, a serial interface permits accessing the nonvolatile memory of the circuit at a system level and enables many configurable circuits to be cascaded.

DESCRIPTION OF THE PREFERRED EMBODIMENT

Figure 1:
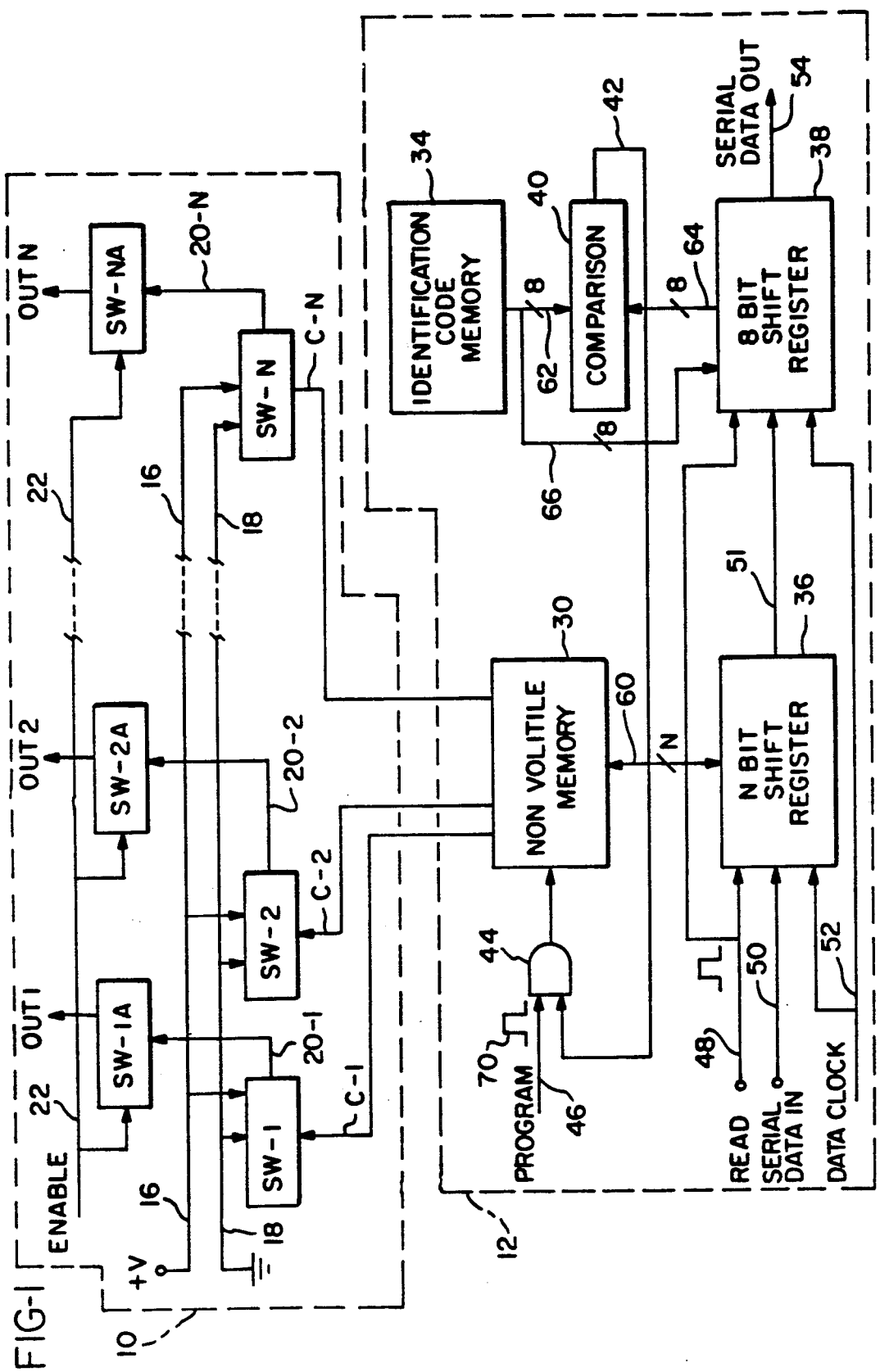
FIG. 1 is a diagram of a configurable solid state DIP switch and its configuration control interface.

Illustrated in FIG. 1 is an N output configurable solid state DIP switch 10 (where N may be any number from 1 to 32 or more) and a serial interface 12 therefor which enables the configurable DIP switch circuit 10 to be electronically programmed and reprogrammed and to have its configuration state read out remotely.

The configurable circuit 10, shown merely as an example of one kind of electrically configurable switch circuit, is substantially conventional, having N switches each providing three different outputs at each of the output lines labeled OUT 1, OUT 2, and OUT N. Each switch functionally comprises a pair of switches, SW-1 and SW-1a for one switch, SW-2 and SW-2a for a second, etc. Switches SW-1 and SW-2, etc. each has two inputs, one from a +V line 16 and the other from a ground line 18, and provide outputs on lines 20-1, 20-2 and 20-N respectively, which are fed to a second part of each switch, such as SW-1a and SW-2a, etc. An enable input on a common line 22 opens or closes each of the secondary switches SW-1a, SW-2a, etc. to connect its input 20-1, 20-2, etc. to its output, OUT 1 or OUT 2, respectively. Each of the primary switches SW-1 and SW-2 etc., has a controlling input from an individual one of switch control lines C-1, C-2, and C-N, respectively, which are provided from the output of a nonvolatile memory 30 that forms part of the configuration control interface 12. Depending upon the state of its control line C-1, which will have either a high or low level, that is, a logic 1 or 0, switch SW-1 will connect either the ground line 18 or the positive voltage line 16 to its output 20-1. Depending upon the state of the enable line 22, which is provided from an external circuit (not shown), the secondary switch SW-1a will provide either a direct connection or an open circuit between OUT 1 and input line 20-1. All of the switches of the DIP switch are alike, and thus the configuration of the DIP switch circuit is controlled by the level of logic signals on all of the control lines C-1, C-2, through C-N.

In addition to the nonvolatile memory 30, which may be an EEPROM (electronically erasable programmable memory) embodying memory cells of the type illustrated in U.S. Pat. No. 4,571,704 of Frank J. Bohac, Jr. for Nonvolatile Latch, the configuration control interface 12 includes an identification code (ID) memory 34, which may be a storage register or other suitable nonvolatile or permanent memory, and a dual or two section shift register comprising an N bit shift register section 36 and an 8 bit shift register section 38. Also included in the configuration control interface is an 8 bit parallel comparison circuit 40 for comparing an interrogation code in shift register 38 with the identification code in ID memory 34. Comparison circuit 40, upon occurrence of a match of all 8 bits of the ID code and the interrogation code, provides on an output line 42 a match pulse which is fed as one input to an AND or program gate 44, having as its second input a program command signal on an input line 46. The output of the gate 44 is connected to the nonvolatile memory 30 and is operable to trigger a parallel transfer of configuration data stored in the N bit shift register 36 into the nonvolatile memory 30.

In addition to the program command signal input on line 46 the configuration control interface circuit 12 includes a read input on an input line 48, a serial data input on a line 50, and a data clock input on a line 52. The read input on line 48 is fed into both sections 36, 38 of the shift register, as is the data clock on line 52. A serial bit stream comprising a series of bits having a first section containing an 8 bit interrogation code and a following section containing N bits of configuration data is serially shifted into the input of N bit register are shifted out on a line 51 and thence into the 8 bit shift register section 38. The serially connected shift register sections are provided with a single serial data output on a line 54 from the output of the 8 bit register section 38. The N bit length of the first shift register section 36 is equal to the number of bits in the nonvolatile memory 30, which may be 16, for example. The length of the second shift register section 38 is equal to the length of the ID code in memory 34, which in the embodiment illustrated herein for purposes of exposition is 8 bits. It will be readily understood that the registers may be of different lengths, and the memories 30 and 34 may have different sizes for storing different numbers of configuration bits and different numbers of identification code bits as may be deemed necessary or desirable. The identification code permanently stored in ID memory 34 is unique to the specific and individual configurable DIP switch circuit 10, and thus enables identification and selection of this circuit when a plurality of such circuits are connected in a chain, as will be more particularly described below.

The nonvolatile memory 30 continuously provides electrical signals of appropriate logic levels on its output lines C-1, C-2, etc., and thus maintains the configurable circuit 10 in a selected configuration It may be noted at this point that the nonvolatile memory may be of many different types, but when made in the configuration illustrated in the above-mentioned U.S. Pat. No. 4,571,704 this memory 30 will latch and retain its last programmed state, even when power is removed from the memory. The correct state of the memory is automatically restored when power is reapplied.

The described arrangement not only provides for reconfiguration of the DIP switch circuit 10 but also allows readout of the actual configured state of the DIP switch. This configured state, of course, is determined by the contents of nonvolatile memory 30 so that readout of the contents of memory 30 provides a readout of the state of the configurable circuit.

To read the contents of memory 30, and also to simultaneously read the ID code from memory 34, the read input on line 48, normally low, is pulsed high. This read pulse initiates a parallel loading of data from the nonvolatile memory 30 into the N bit shift register section 36, and also initiates a parallel load of the ID code from memory 34 to the interrogation shift register 38. It may be noted that the drawing convention used herein shows a single line connecting two of the elements, such as a line 60 connecting nonvolatile memory 30 and shift register section 36. There is a short slant line across the connecting line 60 adjacent a number symbol, such as N. This denotes the fact that the single line shown in the drawing is actually N separate lines. Thus the data line 62 connecting ID memory 34, and comparison circuit 40 and data lines 64 and 66 connecting shift register section 38 with the comparison circuit 40 and with the ID memory 34 also are shown in the drawing to comprise eight separate lines to enable simultaneous parallel transfer of 8 bits between these components.

After occurrence of the read pulse, register section 38 contains the ID code of the particular device that is being read, and register section 36 contains the data from its nonvolatile memory. Then, on serial shifting out of the data from the two shift register sections in response to data clock pulses on line 52, the first eight bits will appear on serial data output line 54 and comprise the 8 bits from the shift register 38, which collectively form the identification code extracted from ID memory 34. The next N bits appearing on serial output line 54, which are serially transferred from shift register section 36 to and through shift register section 38, are clocked out on output line 54 and identify the contents of the nonvolatile memory.

In order to initially configure or later reconfigure DIP switch circuit 10 it is necessary to provide a serial data bit stream on serial data input line 50 that comprises the desired eight bit ID code (which is an interrogation code) of the circuit 10 followed by N bits of configuration data which are serially clocked in to the two shift register sections. Assuming that the nonvolatile memory 30 contains 16 bits of data and the same number of bits is contained in the data section of the shift register, and further assuming that the ID code is 8 bits, a total of 24 bits is serially clocked in via input line 50 and shift register interconnection line 51, under control of the data clock pulses on line 52. After clocking in the 24 pulses, shift register section 38 contains the 8 bit interrogation code chosen to uniquely select the DIP circuit 10, and shift register section 36 contains the configuration data that is to be entered into the nonvolatile memory. Comparison circuit 40 compares the ID code bits in memory 34 with the interrogation code bits in register 38, and if all 8 bits of the two are found to match, a match signal is provided on output line 42 to enable the gate 44. After the comparison has been completed and gate 44 enabled, a positive going program pulse 70 is applied as a second input to gate 44 to initiate a parallel transfer of the configuration data from shift register section 36 to the nonvolatile memory 30. As the individual data bit storage cells of the nonvolatile memory 30 change, the logic levels on its output lines C-1, C-2 through C-N similarly change, to thereby reconfigure the solid state DIP switch circuit If deemed necessary or desirable, the nonvolatile memory may be so configured that the previous data, namely that already stored in the nonvolatile memory, are effectively latched at the beginning of the programming pulse (the positive going edge of the positive going program pulse 70), and changes to a new value on its output lines C-1, C-2 through C-N only on the trailing edge of the program pulse. This avoids transfer of the uncertain or varying state of the memory cells during the short interval during which the state of the cells is being changed.

Figure 2:
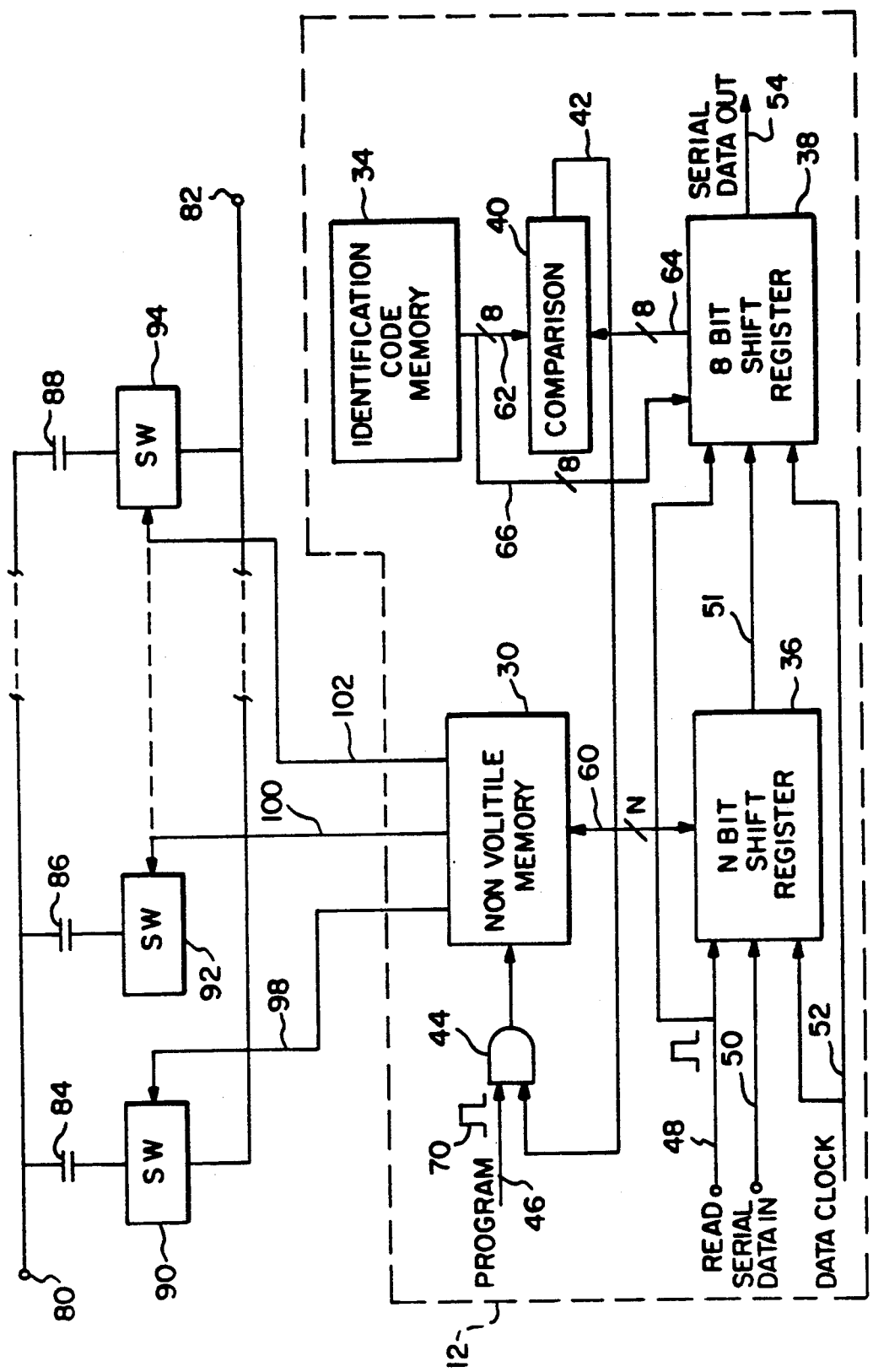
FIG. 2 illustrates a configurable solid state trim capacitor and its configuration control interface.

Illustrated in FIG. 2 is a serially programmable solid state trim capacitor and its configuration control interface. The trim capacitor provides a variable capacitance between terminals 80 and 82 by selectively connecting a plurality of capacitors 84, 86 and 88 in parallel, with each capacitor being connected or disconnected from the circuit between terminals 80 and 82 by an individual one of a plurality of bi-directional solid state switches 90, 92 and 94, there being one switch for each capacitor. In an exemplary embodiment there may be 8 capacitors so that the total capacitance between terminals 80 and 82 may be changed in many steps. Each of the capacitor controlling switches 90, 92 and 94 itself is controlled by a signal of logic level 1 or 0 on configuration control lines 98, 100, 102, there being one such line for each of the exemplary eight switches in this trim capacitor. The control lines 98, 100, 102 provide logic signals derived from the nonvolatile memory 30 of the configuration control interface The configuration control interface 12 employed for the configurable solid state trim capacitor shown in FIG. 2 is identical to the configuration control interface of FIG. 1 and includes the same elements, same inputs and same outputs, namely the nonvolatile memory 30, ID code memory 34, comparison circuit 40, coincidence gate 44, and shift register sections 36 and 38, together with the appropriate inputs and outputs. The only difference between the two is in the specific ID code stored in the fixed memory 34. The ID code for the trim capacitor is unique to this circuit. Of course the size of the nonvolatile memory is chosen in accordance with the number of control inputs required by the configurable trim capacitor Thus if there are eight capacitors in the solid state trim capacitor, the nonvolatile memory will store eight bits of configuration data and have eight control lines interconnecting the configurable circuit and the nonvolatile memory. Similarly, the shift register section 36 has a length equal to the number of bits in the nonvolatile memory.

Figure 3:
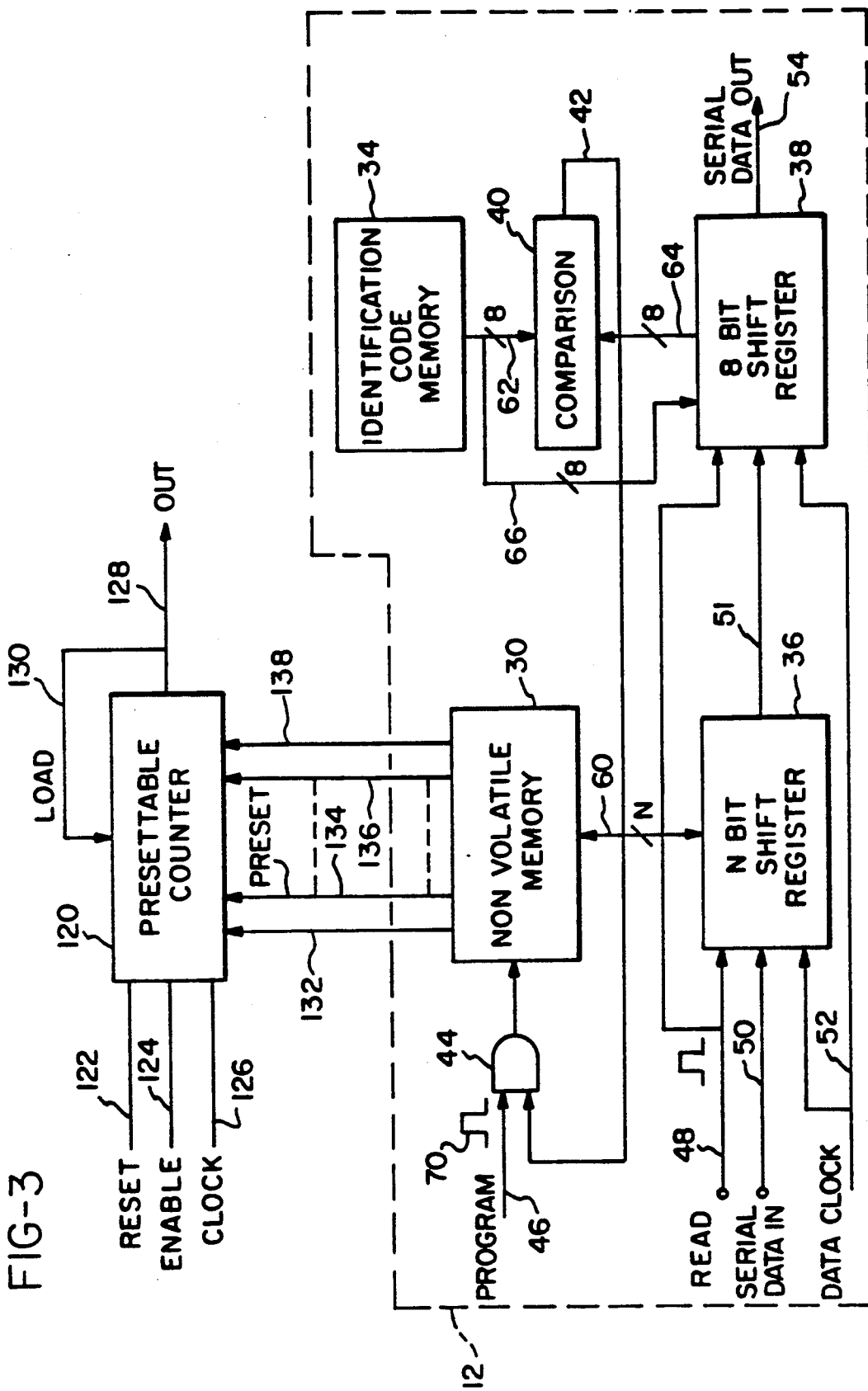
FIG. 3 shows a configurable pre-settable counter and its configuration control interface.

Still another type of nonvolatile serially programmable circuit is illustrated in FIG. 3 in the form of a conventional configurable pre-settable counter settable counter 120, having reset, enable and clock inputs on input lines 122, 124 and 126 respectively, and an output line 128, with a feedback or load line 130 that effects a reloading of the counter upon occurrence of an output. Functionally, the pre-settable counter is often used as a divider that divides by the (pre-set) number of stages of the counter. Being a pre-settable counter, the counter may divide by any number within its capacity so that, for example, for a 16 stage counter the counter will divide by any number between 2 and $2^{16}$. The particular number by which the counter divides is selected by presetting a particular number into the counter. Normally the counter, when enabled, counts clock pulses, counting down from its maximum or pre-set count until, at 0 count, an output pulse is provided on output line 128, which is employed via line 130 to re-load the pre-set value into the counter. The pre-set value of the counter is established by a plurality of pre-set input lines 132, 134, 136 and 138, it being understood that there is one such pre-set line for each stage of the counter. Thus, for a 16 stage counter there are 16 pre-set input lines, each of which is connected to provide a logic signal from the nonvolatile memory 30 of the configuration control interface 12. Again, the interface 12 of the configurable counter is essentially identical with the interfaces previously described, but differs in that its ID code memory 34 is unique to this pre-settable counter circuit and that a nonvolatile memory of 16 bits is employed because the pre-settable counter has 16 stages. The shift register section 36 that contains the configuration data is expanded to enable storage of 16 bits for transfer of such data between the shift register section 36 and the memory 30.

Configuring and reconfiguring of this pre-settable counter is the same as the configuring and reconfiguring of the DIP switch and trim capacitor circuits previously described. The pre-set state or configuration of the counter is read out by a read pulse applied to the shift register. The desired data is contained in the serial bit stream output that the read pulse causes to be shifted out from the second shift register section 38. This serial bit stream includes the 8 bits of the ID code of the counter circuit followed by the 16 bits of non-volatile memory data contained in shift register section 36. Programming of the counter 120 to pre-set it to a given number or to change the pre-set of the counter is accomplished by shifting into the shift register a bit stream having a first group of bits comprising an interrogation code that is the same as the ID code of the counter, and having a second group of data bits that define the pre-set state to which the counter is to be configured. As previously described, upon successful comparison of the ID code in memory 34 with the interrogation code introduced into shift register section 38, the match pulse enables the program gate 44 so that a program pulse will transfer configuration data from shift register section 36 to the nonvolatile memory, which in turn controls the pre-set values of the counter.

One or more of the nonvolatile serially programmable devices described herein may be fabricated on a single integrated circuit chip or circuit board and may be provided as additional circuits on a circuit board carrying a system that is to be controlled or adjusted by the configurable capacitor, counter, switching array or the like. The devices are preferably made using conventional CMOS technology. They require very low power and operate over a wide voltage and temperature range. Redundant circuit techniques may be used to improve reliability and life of the EEPROM memories, and only a single positive power supply may be needed.

Figure 4:
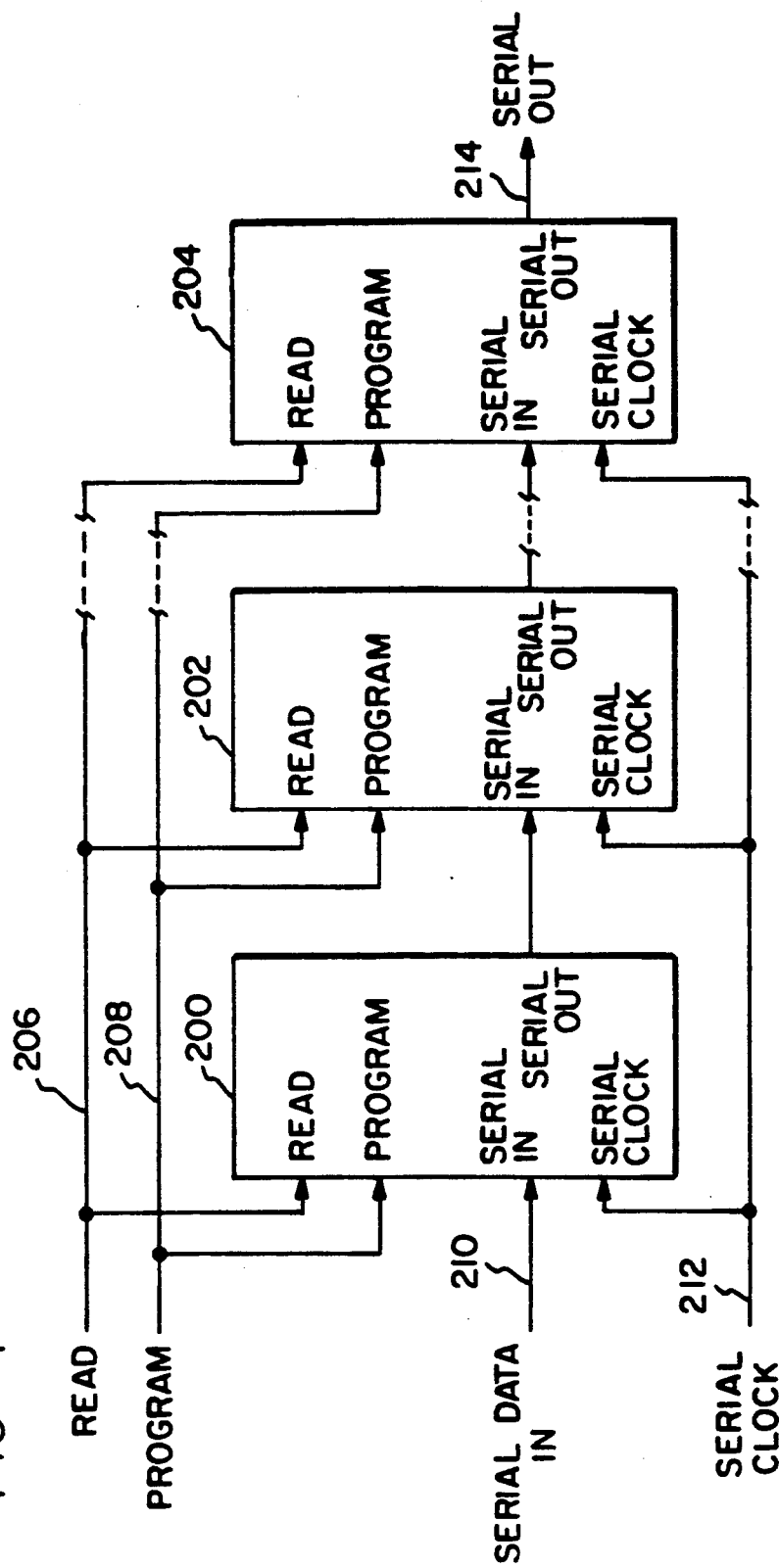
FIG. 4 shows a chain of configurable circuits and their configuration control interfaces.

FIG. 4 illustrates the connection of a number of nonvolatile serially programmable devices in a chain or series of such devices. The several devices illustrated in FIG. 4 are identified as device 200, device 202 and device 204, it being understood that the drawing illustrates an exemplary connection of several devices in a series arrangement, but any number of such devices may be so connected. All of the devices of the chain of devices share common input lines. These common inputs include read, program, and serial clock inputs on lines 206, 208 and 212, all of which are provided as inputs to each device of the chain of devices. Serial data input is provided to all devices on a line 210 that feeds only to the shift register of the first device 200. All devices employ the single serial output line 214, which is the output from the interrogation shift register of the last of the devices, device 204, in the chain. The various shift register section pairs of each of the devices are effectively cascaded, with the output of the shift register of one device being connected to the serial input of the first shift register section of the next device. The serial data input is fed to the shift register of the first device, thence from the output of this shift register to the input of the shift register of the next device, and so on, until the input data has reached the shift register of the last device. Typically the serial input of the first device and the serial output of the last device may be connected to a suitable programming unit, such as a personal computer or a microprocessor. When a group of devices are connected in this manner, any number of devices can be accessed with merely the five interface lines 206, 208, 210, 212 and 214. If for a particular application it is not necessary to be able to read the state of each of the devices, the read line 206 may be omitted. In such case the interface connection can be reduced solely to three lines, namely three input lines, as no output line or read line is needed.

The several devices connected in the chain shown in FIG. 4 may include circuits such as one or more of the programmable and configurable circuits illustrated in FIGS. 1, 2 and 3, respectively. In addition, many other types of configurable circuits may be employed with the described interface, including, without limitation, a quad analog switch having a plurality of bi-directional switches that allow data to flow in one direction or the other in accordance with a control input, a multi-channel analog data selector that will allow data from a number of inputs to be connected selectively in parallel to a common output or which can provide data scanning functions, a solid state trim potentiometer comprising an array of resistors that are individually and selectively connected together in a single resistor array to vary the total array resistance, a sine/cosine generator that employs a pre-settable counter to control the division in circuitry that determines frequency. In the programmable frequency sine/cosine generator the output frequency is a programmable function of input clock frequency. In such a generator the nonvolatile memory data configures the circuit to provide for division of the input clock signal by a number that varies (for a 16 stage counter) up to $2^{16}$. These are merely further examples that are illustrations of the very broad range of circuits that may be remotely configured by the described configuration control interface arrangement. Any one or more of such configurable circuits may be employed individually in individual ones of the devices 200, 202 and 204 of the device chain of FIG. 4. Each configurable circuit of course is provided with its own specific and unique identification code so that any one or more of the configurable circuits may be individually accessed for reading out its state or for programming its nonvolatile memory to reconfigure the circuit.

A typical reconfiguration procedure is to first read the state of all of the devices in the chain and then modify one or more of them. By providing a read pulse on the read input on line 206 of FIG. 4 and then clocking the shift registers by providing clock pulses on serial clock input 212 (clocking all of the shift registers), the number of devices in the ring, their part types (identification codes) and the contents of their nonvolatile memories can all be determined. All of this information is provided in order and in sequence in the serial bit stream output appearing on output line 214 in response to the read pulse. For example, after a read pulse is provided, the first eight clock pulses will shift the ID code of the last device (device 204) out of the interrogation register of the last device. From this ID code the device type and number of data bits to follow can be determined, because the number of data bits in each device has been predetermined. The number of data bits of the last device, device 204, is important information because it determines the position of the next ID code. In other words, assuming an ID code of 8 bits and 16 bits in the nonvolatile memory of the last device, the first 24 bits that appear on the serial output 214 after clocking out the shift registers are all related to the last device. The succeeding 8 bits of this serial bit stream then identify the next to the last device and the predetermined number of its data bits immediately follow. Thus each device can be read in succession by reading the ID code and then clocking out the appropriate number of data bits for the device identified by such ID code. The position of the first device can be verified by shifting in an illegal ID code to the shift register of the first device when the read process begins. Thus the illegal code will immediately follow the tail end of the shifted out bit stream. The data bits of the last device of which data is read out, namely device 200, comprise the end of the shifted out bit stream.

To program a new configuration into a selected one of the devices of the chain of devices of FIG. 4, the programming unit (such as a PC or like computer) simply shifts the correct ID code and data into the proper device and then pulses the program input. To shift the correct data into a selected device, its location in the chain must be known and, also, the number of bits in each of the register sections between the chain input and the selected device. With this knowledge the ID code and configuration data of the selected device are then appropriately positioned in the sequence of input data bits, that is, the data are clocked into and through the several shift registers until the ID code for the selected device arrives at the interrogation register of the selected device. If the configuration of only one of the circuits is to be changed, then the bit stream applied via line 210 is configured so that it includes an interrogation group of pulses for comparison with the ID code of the selected device, immediately followed by the proper number of configuration data bits of the selected device. As previously mentioned, this bit stream is serially shifted into the cascaded shift registers of the chain of devices until the ID code or interrogation of the selected device is in the second section or interrogation section of the shift register of such device. If only a single one of the devices is to be configured, it is important to inhibit programming of all other devices. To this end groups of bits that will be in the interrogation code shift registers of all of the other devices (which are not to be changed) are intentionally caused to provide wrong ID codes for such devices, which then will inhibit programming of such other devices. It will be understood that the programming, that is, the shifting of new configuration data from the data configuration shift register to the nonvolatile memory of a particular device, can take place only upon occurrence of coincidence of the specific device ID code with the interrogation code placed in the interrogation shift register section of such device. Thus, after the appropriate data bits are shifted into the shift registers of the several devices, a programming signal fed to all of the devices will effect programming of only that device in which the interrogation code matches the device ID code. Programming of all other devices is inhibited by the wrong ID code in their interrogation registers. This arrangement of employing interrogation codes and comparison with selected ID codes allows the programming process to modify one device at a time or all devices together The serial interface of the several devices, as illustrated in FIG. 4, allows many nonvolatile programmable devices to be positioned throughout a system at a low overhead cost. A single five pin connector is all that is required to access all of many devices. For example, in an automobile, such configurable circuits and devices could be located in an instrument cluster or body or engine compartment. Various circuits of the vehicle could then be adjusted after assembly when all of the sensors have been connected. Further, as sensors and other components change with time or environmental conditions, all or any one or more of the circuits can be readjusted without having to disassemble various modules and components. Vehicle operation can be diagnosed by reading out configurations of the several circuits. Such features add flexibility in design and result in lower assembly and maintenance costs.

What is claimed is:

1. An electrically programmable device comprising:
    a first electrically configurable circuit,
    a first ID memory having an identification code unique to said first circuit,
    first nonvolatile memory means connected to said first electrically configurable circuit to control configuration of said first electrically configurable circuit according to configuration data stored in said first nonvolatile memory means, and
    first means responsive to said first ID memory for entering configuration data into said first nonvolatile memory means,
    a second electrically configurable circuit,
    a second ID memory having an identification code unique to said second circuit,
    second nonvolatile memory means connected to said second electrically configurable circuit to control configuration of said second configurable circuit according to configuration data stored in said second nonvolatile memory means, and
    second means responsive to said second ID memory for entering into said second nonvolatile memory means a set of configuration data for configuring said second device,
    wherein each said first and second responsive means comprises:
        a shift register having a configuration data section and an interrogation code section,
        comparison means for comparing the code of said respective ID memory with interrogation code in the interrogation code section of the shift register to generate a circuit match signal upon occurrence of a match, and
        means responsive to said circuit match signal for transferring configuration data from said configuration data section of said respective shift register to said respective nonvolatile memory means.

2. The device of claim 1 wherein said means responsive to said first mentioned ID memory comprises a first shift register cascaded with said second shift register.

3. A programmable device comprising:
    an electrically configurable circuit,
    an ID code memory carrying an identification code that uniquely identifies said circuit,
    means for interrogating said ID memory, wherein said means for interrogating comprises:
        an interrogation code memory;
        means for storing an interrogation code in said interrogation code memory, and
        means for comparing the identification code stored in said ID memory and the interrogation code stored in said interrogation code memory, and
    means responsive to said interrogating means for controlling configuration of said circuit, wherein said means for controlling configuration comprises;
        nonvolatile memory means connected to said circuit for controlling configuration of said circuit, and
        means for programming said memory means in response to said interrogation means, wherein said means for programming said nonvolatile memory means comprises a first shift register and mans for transferring information from said first shift register to said nonvolatile memory means,
    wherein said interrogation code memory comprises;
        a second shift register connected in series with said first shift register; and
        means for serially shifting into said first and second shift registers a bit stream having a first group of data bits containing a program for said nonvolatile memory means and having a second group of data bits comprising an interrogation code for comparison with said identification code.

4. The device of claim 3 wherein said electrically configurable circuit comprises a switching circuit.

5. The device of claim 3 wherein said electrically configurable circuit comprise a pre-settable counter circuit.

6. A programmable device comprising:
    an electrically configurable circuit,
    an ID code memory carrying an identification code that uniquely identifies said circuit,
    means for interrogating said ID memory, and
    means responsive to said interrogating means for controlling configuration of said circuit, wherein said electrically configurable circuit comprises a variable capacitor circuit.

7. A method of controlling an electrically configurable circuit comprising the steps of:
    providing the circuit with an identification code;
    comparing an interrogation code with said identification code to generate a match signal when the two codes are a match,
    storing a set of configuration data in a device memory upon occurrence of said match signal, and
    configuring said circuit in accordance with the configuration data stored in said device memory,
    wherein aid step of storing a set of configuration data and said step of comparing comprises shifting said configuration data and interrogation code serially into a shift register having a first section storing said configuration data and having a second section storing said interrogation code.

8. The method of claim 7 wherein said device memory is a nonvolatile memory.

9. The method of claim 7 wherein said step of storing a set of configuration data comprises storing such data in a temporary memory.

10. The method of claim 9 wherein said temporary memory is a shift register.

11. A method of controlling an electrically configurable circuit comprising the steps of:
    providing the circuit with an identification code,
    comparing an interrogation code with said identification code to generate a match signal when the two codes are a match,
    storing a set of configuration data in a device memory upon occurrence of said match signal, and
    configuring said circuit in accordance with the configuration data stored in said device memory,
    wherein said step of storing said set of configuration data in a device memory comprises enabling the device memory for programming in response to occurrence of said match signal and feeding a program command signal to said device memory after occurrence of said match signal.

12. The method of claim 7 including the step of electrically reading out the configuration of said circuit.

13. The method of claim 12 wherein said step of reading out comprises transferring said identification code and the configuration data in said device memory to an output device.

14. The method of claim 7 wherein said step of storing a set of configuration data and said step of comparing comprise the steps of providing a shift register having first and second sections for receiving and storing said configuration data and said interrogation code.

15. The method of claim 14 including the step of reading the configuration of said circuit, said step of reading comprising transferring into said shift register said set of configuration data stored in said circuit memory and said identification code.

16. The method of claim 7 wherein in said electrically configurable circuit is a DIP switch.

17. The method of claim 7 wherein said electrically configurable circuit is a trim capacitor.

18. The method of claim 7 wherein said electrically configurable device includes a pre-settable counter.

19. A method of selectively controlling one or more of a plurality of electrically configurable circuits comprising the steps of:
providing each said circuit with an unique identification code,
providing a plurality of shift registers each unique to a different one of said configurable circuits and each having a data section and an ID section,
serially connecting said registers to enable a bit stream to be serially shifted through each of said registers in sequence,
feeding into a first one of said shift registers a serial bit stream having a plurality of sequential groups of bits where each group includes a data sub-group and an interrogation code sub-group,
storing each of said bit stream groups in an individual one of said shift registers, with said data subgroup of each group contained in the data section of the individual shift register and the interrogation code subgroup of each group being contained in the ID section of the individual shift register,
comparing the interrogation code of the ID section of at least one of the shift registers with the identification code of the corresponding configurable circuit to generate a match signal that identifies such circuit as a chosen circuit when the compared codes are a match, and
configuring said chosen circuit in accordance with the data sub-group of said at least one shift register in response to said match signal.

20. The method of claim 19 wherein said step of configuring comprises transferring the data sub-group from said at least one shift register into a nonvolatile memory, and configuring said chosen circuit in accordance with data in said nonvolatile memory.

21. A plurality of programmable devices connected in a chain and including first and last devices in the chain,
each said device comprising:
an electrically configurable circuit,
an ID memory having an identification code unique to the circuit,
nonvolatile memory means connected to electrically configure the configurable circuit,
a shift register having a data section for storing configuration data and an interrogation section for storing interrogation code data, said shift register having a serial input for receiving serial input data, and having an output for providing a serial data output,
means for transferring data between said data section and said nonvolatile memory means,
means for comparing the interrogation code in said interrogation section with the identification code in said ID memory to provide a match signal upon occurrence of a match between the compared codes, and
a program gate having first and second inputs and having an output connected to said nonvolatile memory to effect transfer of data from said data section to said memory means, said match signal being connected to provide said first input to said program gate, means for providing a program command signal to the second input of said program gate of each said device,
means for providing a serial clock signal to said shift registers of each said device,
means for providing serial input data to the serial input of the shift register of a first device in the chain,
means for providing a read signal to said shift registers of each said device to effect transfer of information from the nonvolatile memory means to the data section of the shift register and to effect transfer of information from said ID memory to said interrogation section of said shift register, and
means for connecting the output of the shift register of each device, except the shift register of the last device in the chain, to the serial input of the shift register of the next adjacent device.

* * * * *